(12) United States Patent
McClure et al.

(10) Patent No.: US 7,675,068 B2
(45) Date of Patent: *Mar. 9, 2010

(54) METHODS OF TREATING A SILICON CARBIDE SUBSTRATE FOR IMPROVED EPITAXIAL DEPOSITION AND RESULTING STRUCTURES AND DEVICES

(75) Inventors: Davis Andrew McClure, Cary, NC (US); Alexander Suvorov, Durham, NC (US); John Adam Edmond, Cary, NC (US); David Beardsley Slater, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 113 days.

This patent is subject to a terminal disclaimer.

(21) Appl. No.: 11/243,581

(22) Filed: Oct. 5, 2005

(65) Prior Publication Data

US 2006/0033111 A1 Feb. 16, 2006

Related U.S. Application Data

(62) Division of application No. 10/709,780, filed on May 27, 2004, now Pat. No. 6,995,398, which is a division of application No. 10/248,586, filed on Jan. 30, 2003, now Pat. No. 7,138,291.

(60) Provisional application No. 60/355,034, filed on Feb. 8, 2002.

(51) Int. Cl.
*H01L 31/0312* (2006.01)

(52) U.S. Cl. .......... 257/77; 257/E21.054; 257/E21.055; 257/E21.056; 257/E21.057; 257/E21.065; 257/E33.025; 257/E33.03

(58) Field of Classification Search .............. 257/77, 257/E21.054, E21.065, E21.055, E21.056, 257/E21.057, E33.025, E33.03

See application file for complete search history.

(56) References Cited

U.S. PATENT DOCUMENTS 3,629,011 A 12/1971 Tohl et al.

(Continued)

FOREIGN PATENT DOCUMENTS

DE 199 44 144 A1 4/2001

(Continued)

OTHER PUBLICATIONS

Scott et al., "High temperature (500 oC) implantation study of P+ and N+ implanted epitaxial N-type 4H-SiC", Compound Semiconductors 1998, Proceedings of the 25th International Symposium on Compound Semiconductors, Institute of Physics Conference Series vol. 162., pp. 763-768.*

(Continued)

*Primary Examiner*—Jerome Jackson, Jr.
*Assistant Examiner*—Jay C Kim
(74) *Attorney, Agent, or Firm*—Summa, Additon & Ashe, P.A.

(57) ABSTRACT

A silicon carbide structure is disclosed that is suitable for use as a substrate in the manufacture of electronic devices such as light emitting diodes. The structure includes a silicon carbide wafer having a first and second surface and having a predetermined conductivity type and an initial carrier concentration; a region of implanted dopant atoms extending from the first surface into the silicon carbide wafer to a predetermined depth, with the region having a higher carrier concentration than the initial carrier concentration in the remainder of the wafer; and an epitaxial layer on the first surface of the silicon carbide wafer.

10 Claims, 3 Drawing Sheets

U.S. PATENT DOCUMENTS

| | | | |
|---|---|---|---|
| 5,027,168 A * | 6/1991 | Edmond | 257/103 |
| 5,273,933 A | 12/1993 | Hatano et al. | |
| 5,523,589 A | 6/1996 | Edmond et al. | |
| 5,543,637 A | 8/1996 | Baliga | |
| 5,727,008 A | 3/1998 | Koga | |
| 5,786,606 A | 7/1998 | Nishio et al. | |
| 5,821,555 A * | 10/1998 | Saito et al. | 257/13 |
| 5,900,647 A | 5/1999 | Inoguchi | |
| 6,083,814 A | 7/2000 | Nilsson | |
| 6,120,600 A | 9/2000 | Edmond et al. | |
| 6,187,606 B1 | 2/2001 | Edmond et al. | |
| 6,232,244 B1 | 5/2001 | Ibok | |
| 6,242,764 B1 * | 6/2001 | Ohba et al. | 257/190 |
| 6,251,754 B1 | 6/2001 | Ohshima et al. | |
| 6,277,707 B1 | 8/2001 | Lee et al. | |
| 6,486,011 B1 | 11/2002 | Yu | |
| 6,552,376 B1 | 4/2003 | Koike et al. | |
| 6,555,452 B2 | 4/2003 | Nikolaev et al. | |
| 6,632,694 B2 | 10/2003 | Torvik | |
| 6,667,495 B2 | 12/2003 | Friedrichs et al. | |
| 6,881,616 B1 | 4/2005 | Hellig et al. | |
| 6,884,644 B1 | 4/2005 | Slater et al. | |
| 6,909,119 B2 | 6/2005 | Slater et al. | |
| 7,151,037 B2 | 12/2006 | Bhattacharyya | |
| 2001/0046757 A1 * | 11/2001 | Takahashi et al. | 438/518 |
| 2002/0031851 A1 | 3/2002 | Linthicum et al. | |
| 2002/0179910 A1 | 12/2002 | Slater, Jr. | |
| 2003/0006417 A1 | 1/2003 | Klosowiak et al. | |
| 2004/0097029 A1 | 5/2004 | Hummler | |
| 2004/0110332 A1 | 6/2004 | King | |

FOREIGN PATENT DOCUMENTS

| | | |
|---|---|---|
| JP | 02-240988 | 9/1990 |
| JP | 08-222812 | 8/1996 |
| JP | 09-008353 | 10/1997 |
| JP | 2001-291900 | 10/2001 |
| WO | 99/17345 | 4/1999 |
| WO | WO 00/16382 | 3/2000 |
| WO | WO 00/79570 A2 | 12/2000 |

OTHER PUBLICATIONS

Machine Translation of JP 2001-291900, Masami et al., Oct. 19, 2001, "Semiconductor Light-Emitting Device and Manufacturing Method Thereof".*

F.J. Campos et al.; Confocal Micro-Raman Characterization of Lattice Damage in High Energy Aluminum Implanted 6H-SIC; Journal of Applied Physics; Jan. 1, 1999; pp. 99-104; vol. 85, No. 1; American Institute of Physics, New York, US.

M.B. Scott et al.; High temperature (500 degrees C) implantation study of P+ and N+ implanted epitaxial N-type 4H-SiC; Compound Semiconductors 1998, Processdings of the 25th Informational Symposium on Compound Semiconductors; Nara, Japan, Oct 12-16, 1998; pp. 763-766; vol. NR. 162: Institute of Physics Conference Sertoa, London.

Issey Ohta et al.; An Ideal-Profile Implantation Process for GaAs Analog MMICs; Proceedings of the Gallium Arsonide Integrated Circuit Symposium, Greneiefe, Florida, Oct. 28-30, 1986: pp. 55-58 vol. SYMP. 8; IEEE, New York, US.

W. M. Duncan et al.; A Single Step Selective Implantation Technology for Multiply Doped Layers Using Proximity Annealing: IEEE Electron Device Letters: Dec. 1981; pp. 309-311; vol. EDL-2, No. 12: IEEE Inc,. New York, US.

H.J. Hovel; Implant Profile Adjustment with GaAlAs Cape; IBM Technical Disclosure Bulletin: Feb. 1985; pp. 5360-5361; vol. 27, No. 9; IBM Corp., New York, US.

S.K. Lee; Electrical characterization of TIC ohmic contacts to aluminum Ion Implented 4H-silicon carbide; Applied Physics Letters; Sep. 4, 2000; pp. 1478-180; vol. 77, No. 10.

* cited by examiner

US 7,675,068 B2

METHODS OF TREATING A SILICON CARBIDE SUBSTRATE FOR IMPROVED EPITAXIAL DEPOSITION AND RESULTING STRUCTURES AND DEVICES

CROSS-REFERENCE TO RELATED APPLICATIONS

This application is a divisional of application Ser. No. 10/709,780 filed May 27, 2004 now U.S. Pat. No. 6,995,398 which is a divisional of Ser. No. 10/248,586, filed Jan. 30, 2003 now U.S. Pat. No. 7,138,291, which claims the benefit of provisional application Ser. No. 60/355,034, filed Feb. 8, 2002.

BACKGROUND

To date, the most successful materials for producing light emitting devices or "LEDs" (including light emitting diodes, laser diodes, photodetectors and the like) capable of operation in the UV, blue and green portions of the electromagnetic spectrum have been the group III-nitride compound semiconductor materials, and in particular gallium nitride-based compound semiconductors. However, gallium nitride presents a particular set of technical problems in manufacturing working devices. The primary problem is the lack of bulk single crystals of gallium nitride which in turn means that gallium nitride or other group III-nitride devices must be formed as epitaxial layers on other materials. Sapphire (i.e., aluminum oxide or Al2O3) has been commonly used as a substrate for group III-nitride devices. Sapphire offers a reasonable crystal lattice match to Group III nitrides, thermal stability, and transparency, all of which are generally useful in producing a light emitting diode. Sapphire offers the disadvantage, however, of being an electrical insulator. This means that the electric current that is passed through an LED to generate the emission cannot be directed through the sapphire substrate. Thus, other types of connections to the LED must be made, such as placing both the cathode and anode of the device on the same side of the LED chip in a so-called "horizontal" configuration. In general, it is preferable for an LED to be fabricated on a conductive substrate so that ohmic contacts can be placed at opposite ends of the device. Such devices, called "vertical" devices, are preferred for a number of reasons, including their easier manufacture as compared to horizontal devices.

In contrast to sapphire, silicon carbide can be conductively doped, and therefore can be effectively used to manufacture a vertical group III-nitride LED. In addition, silicon carbide has a relatively small lattice mismatch with gallium nitride, which means that high-quality group III-nitride material can be grown on it. Silicon carbide also has a high coefficient of thermal conductivity, which is important for heat dissipation in high-current devices such as laser diodes.

Examples of silicon carbide-based group III-nitride LEDs are shown in U.S. Pat. Nos. 5,523,589, 6120,600 and 6,187,606 each of which is assigned to Cree, Inc., the assignee of the present invention, and each of which is incorporated herein by reference. Such devices typically comprise a silicon carbide substrate, a buffer layer or region formed on the substrate, and a plurality of group III-nitride layers forming a p-n junction active region.

In particular, U.S. Pat. No. 6,187,606 represents an important advance over the state of the art as it previously existed. The invention described in the '606 patent provided a plurality of discrete crystal portions, or "dots," of GaN or InGaN on the substrate in an amount sufficient to minimize or eliminate the heterobarrier between the substrate and the buffer layer. A highly conductive path between the substrate and the active region could thereby be established.

An important parameter for LEDs is the forward voltage (Vf) drop between the anode and the cathode of the device during forward bias operation. In particular, it is desirable for the forward voltage (Vf) of a device to be as low as possible to reduce power consumption and increase the overall efficiency of the device. Despite the advance of the '606 patent, there remains a measurable voltage drop at the interface between a conventional silicon carbide substrate and the conductive buffer layer. It is desirable to reduce this voltage drop in order to reduce the overall Vf of the resulting device.

SUMMARY

The invention is a silicon carbide structure suitable for use as a substrate in the manufacture of electronic devices such as light emitting diodes comprising: a silicon carbide wafer having a first and second surface and having a predetermined conductivity type and an initial carrier concentration; a region of implanted dopant atoms extending from the first surface into the silicon carbide wafer to a predetermined depth, the region having a higher carrier concentration than the initial carrier concentration in the remainder of the wafer; and an epitaxial layer on the first surface of the silicon carbide wafer.

DESCRIPTION

Methods according to embodiments of the present invention include the steps of providing a SiC wafer having a predetermined conductivity type and first and second surfaces; implanting dopant atoms of the predetermined conductivity type into the first surface of the SiC wafer at one or more predetermined dopant concentrations and implant energies to form a dopant profile; annealing the implanted wafer; and growing an epitaxial layer on the implanted first surface of the substrate. Other methods according to embodiments of the present invention include the steps of providing a SiC wafer having a predetermined conductivity type and first and second surfaces; forming a capping layer on the first surface of the wafer; implanting dopant atoms of the predetermined conductivity type into the capping layer and the first surface of the SiC wafer at one or more predetermined dopant concentrations and implant energies to form a dopant profile; annealing the implanted wafer; removing the capping layer; and growing an epitaxial layer on the implanted first surface of the substrate.

Structures according to embodiments the present invention include a silicon carbide substrate having a predetermined conductivity type and having first and second surfaces with a first implantation profile of implanted dopants of the predetermined conductivity type adjacent the first surface and an epitaxial layer grown on the first surface.

Devices according to embodiments of the present invention include a light emitting device comprising a silicon carbide substrate having a predetermined conductivity-type and first and second surfaces, a conductive buffer layer on the first surface of the substrate, and an active region on the conductive buffer, wherein the first surface of the substrate has a first implantation profile of implanted dopants of the predetermined conductivity type adjacent the first surface.

Figure 1:
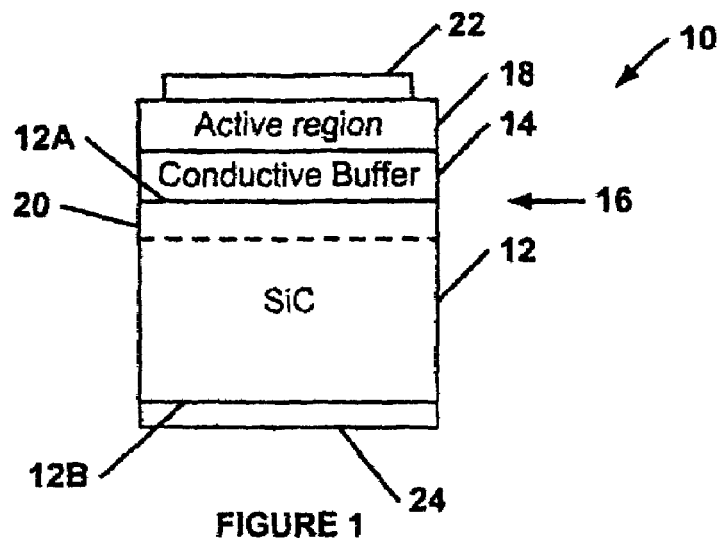
FIG. 1 is a simplified schematic of a silicon carbide-based LED according to the present invention.

Referring to FIG. 1 which shows a simplified schematic of a silicon carbide-based LED according to the present invention, device 10 comprises a conductive silicon carbide substrate 12 having a first conductivity type and having a first surface 12A and a second surface 12B. Device 10 further includes a conductive buffer region 14 formed on surface 12A of substrate 12 and an active region 18 formed on the conductive buffer 14. Active region 18 preferably includes a p-n junction and most preferably comprises a single heterostructure, double heterostructure, single quantum well, multiple quantum well or the like. A first ohmic contact 22 is formed on the surface of the active region. A second ohmic contact 24 is formed on the surface of the substrate 24. In a preferred embodiment, substrate 12 comprises n-type 4H-silicon carbide. Accordingly, in a preferred embodiment ohmic contact 22 comprises the anode of the device 10 while ohmic contact 24 comprises the cathode of the device 10. Ohmic contact 24 may be formed according to the methods described in U.S. patent application Ser. No. 09/787,189 filed March 15, 2001 which is incorporated herein by reference. Substrate 12 includes a first implanted region 20 adjacent to surface 12A and comprising implanted dopant atoms of the first conductivity type. The presence of implanted region 20 causes a reduction in the voltage drop observable at the interface between substrate 12 and buffer region 14, which results in a reduction in the overall forward operating voltage (Vf) of the device 10. The implanted region has a peak concentration of implanted dopant atoms of between about 1E19 and 5E21 cm-3 and is between about 10 and 5000 Å thick. Preferably, the implanted region has a peak concentration of implanted dopant atoms of about 1E21 cm-3 and is about 500 Å thick.

Figure 2:
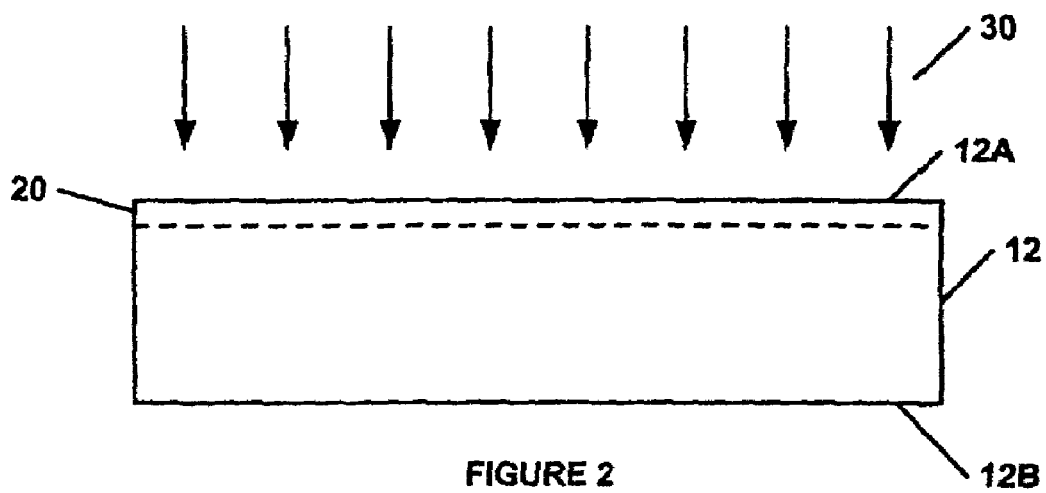
FIG. 2 illustrates a method of fabrication of structures according to the present invention.

FIG. 2 illustrates a method of fabrication of structures according to the present invention. A silicon carbide substrate 12 is provided having a first conductivity type and having first surface 12A and second surface 12B. The fabrication of doped silicon carbide substrates such as substrate 12 is well known in the art. For example, U.S. Pat. RE34,861 discloses a process for growing boules of silicon carbide via controlled seeded sublimation. The resulting silicon carbide crystal may exhibit one of a number of polytypes, such as 4H, 6H, 15R or others. N-type dopants such as nitrogen and/or phosphorus or p-type dopants such as aluminum and/or boron may be incorporated into the crystal during growth to impart a net n-type or p-type conductivity, respectively. The crystal boules are then sliced into wafers which are chemically and mechanically treated (polished) to provide a suitable substrate for the growth of epitaxial layers and the fabrication of electronic devices thereon.

In a preferred embodiment, substrate 12 comprises n-type 4H or 6H-silicon carbide doped with nitrogen donor atoms at a net dopant concentration of about 5E17 to 3E18 cm-2. Subsequent to wafering and polishing, dopant atoms 30 of a predetermined conductivity type are implanted into surface 12A of substrate 12 at one or more predetermined dopant concentrations and implant energies to form a dopant profile in implanted region 20 of substrate 12. Preferably, dopant atoms 30 have the same conductivity type as substrate 12. That is, if substrate 12 is n-type, then dopants 30 comprise a dopant such as nitrogen and/or phosphorus that imparts n-type conductivity in silicon carbide. Alternatively, if substrate 12 is p-type, then dopants 30 comprise a dopant such as boron or aluminum that imparts p-type conductivity in silicon carbide.

Dopants 30 are implanted into substrate 12 through surface 12A according to an predetermined implant dose and energy level. Implantation may be performed in one step at a single dose and energy level or in a plurality of steps at multiple doses and/or multiple energy levels. In a preferred embodiment, implantation is performed via a plurality of implant doses and energy levels in order to impart a relatively flat implantation profile to a predetermined depth within substrate 12. For example, in one embodiment, a 6H-silicon carbide substrate is implanted with phosphorus atoms at a first dose of 2E15 cm-2 and an energy of 25 keV and a second dose of 3.6E15 cm-2 at an energy of 50 keV.

Figure 4:
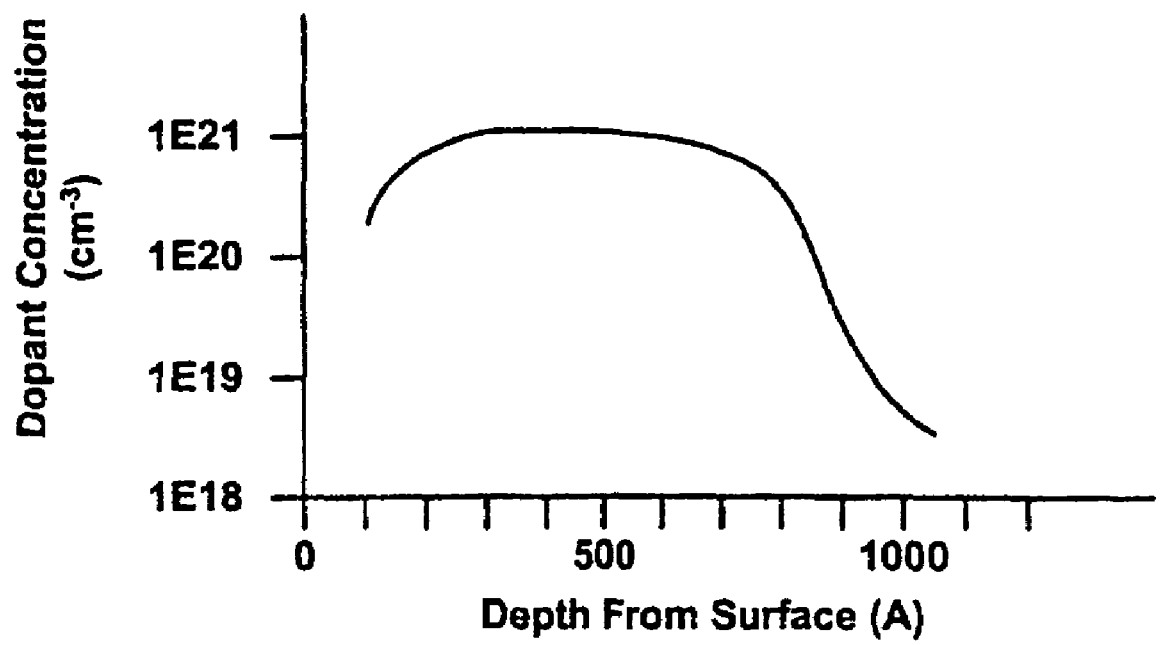
FIG. 4 is a schematic illustration of a desired depth profile that could be formed according to the invention.

A schematic of a desired depth profile that could be formed according to this embodiment is shown the graph of FIG. 4. The graph of FIG. 4 shows the profile of implanted atoms in atoms/cm3 (y-axis) as a function of depth in angstroms from the first surface 12A of substrate 12 (x-axis). As shown in FIG. 4, the implant profile increases to a maximum of about 1E21 cm-3 at a depth of about 300 Å. From there, the profile stays relatively flat to a depth of about 800 Å, and then begins to drop off to background levels. Accordingly, implanted region 20 may be said to extend from surface 12A into substrate 12 for a depth of about 800-1000 Å.

Following the implantation, the substrate is annealed in a standard tube anneal in Argon at a temperature of 1300° for 90 minutes to activate the implanted dopants. A range of temperatures is also effective for annealing, with 1300° being exemplary rather than limiting.

A conductive buffer 14 may then formed on surface 12A of substrate 12.

One drawback of this embodiment is that the dopant profile tends to reach its maximum at some depth within the substrate, determined by the implant doses and energies. That is, the implant concentration at the surface is less than the maximum concentration within the substrate. Implanted dopant concentrations must be kept at less than about 5E21 cm-3 or else the implanted atoms will cause unwanted and irreparable damage to the crystal lattice of substrate 12.

In order to provide the maximum improvement in voltage drop, it is desirable to have the implant concentration at the surface at the surface of the substrate at as high a level as possible, i.e., the implant concentration at the surface should be around 1E21 cm-3. However, in order to achieve such a surface concentration according to the embodiment of FIG. 2, it would be necessary to implant the dopant atoms at a dose and energy level that would produce dopant concentrations within the substrate that would damage the substrate as described above.

Figure 3:
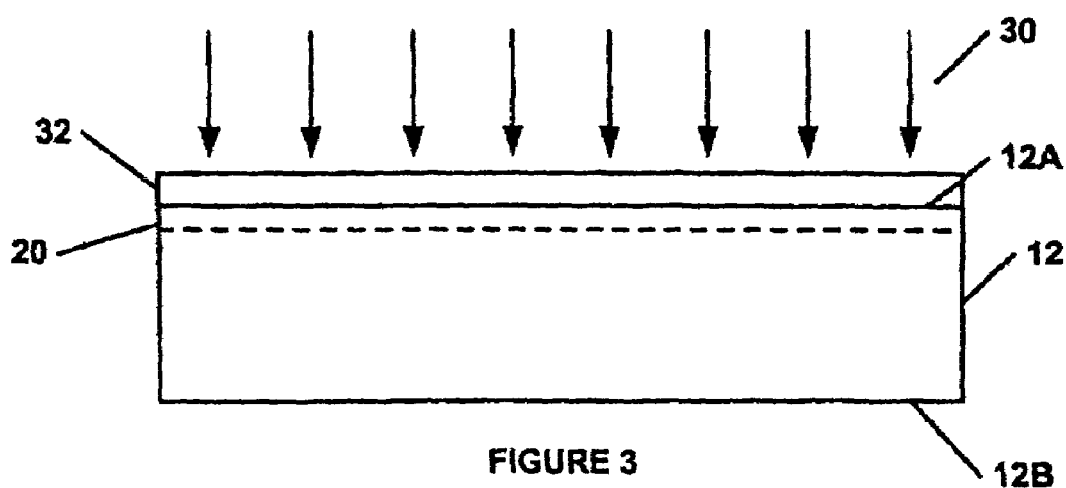
FIG. 3 illustrates another embodiment of the invention that includes a capping layer

Accordingly, in another embodiment of the invention illustrated in FIG. 3, a capping layer 32 is deposited on surface 12A of substrate 12 prior to dopant implantation. Preferably, capping layer 32 comprises a silicon nitride layer or a silicon dioxide layer deposited using Plasma-Enhanced Chemical Vapor Deposition (PECVD) or grown as a thermal oxide, both of which are well known processes capable for depositing oxide layers of precise thickness and composition. Capping layer 32 may also comprise any other suitable material that may be controllably deposited in thin layers, is susceptible to ion implantation and can be removed without damaging the underlying surface. Other possible materials for capping layer 32 include a metal layer or an epitaxial semiconductor layer.

The thickness of capping layer 32 and the implantation parameters (dose and energy) are selected such that the maximum implant concentration resulting from the implantation step occurs at or near the surface 12A of the substrate 12 (i.e., at or near the interface between substrate 12 and capping layer 32). The resulting structure is then annealed in a standard tube anneal in argon at a temperature of 1300° C. for 90 minutes to activate the implanted dopants. Capping layer 32 is removed using conventional techniques. For example, if capping layer 32 comprises a PECVD oxide layer, it may be removed with a wet chemical etch process. The resulting structure then ideally comprises a substrate 12 having an implanted region 20 wherein the peak concentration of implanted atoms in the implanted region 20 occurs at or near surface 12A of substrate 12.

Figure 5:
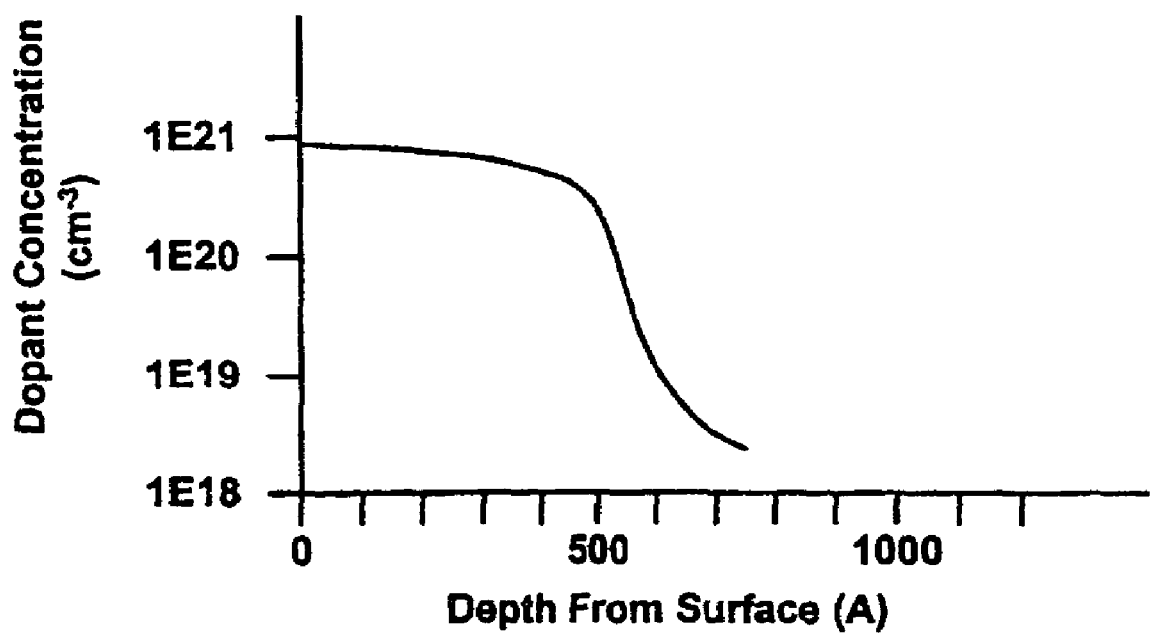
FIG. 5 is a schematic illustration of another desired depth profile that could be formed according to the invention.

A schematic of the desired depth profile that could be formed according to this embodiment is shown the graph of FIG. 5. The graph of FIG. 5 shows a schematic profile of implanted atoms in atoms/cm3 (y-axis) as a function of depth in angstroms from the first surface 12A of substrate 12. As shown in FIG. 4, the implant profile is approximately 1E21 cm-3 at a the surface 12A of the substrate 12. From there, the profile stays relatively flat for a depth of about 500 Å, and then begins to drop off to background levels.

In one embodiment, a silicon dioxide layer 32 having a thickness of about 500 Å is formed via PECVD on surface 12A of substrate 12. Nitrogen atoms are implanted into the oxide layer and the substrate 12 in a first dose at an implant energy of 25 keV and a second dose at an implant energy of 50 keV. The first implant may have a dose of about 4E12 cm-2 to 1E15 cm-2, while the second implant hay have a dose of about 7E12 cm-2 to 1.8E15 cm-2.

Figure 6:
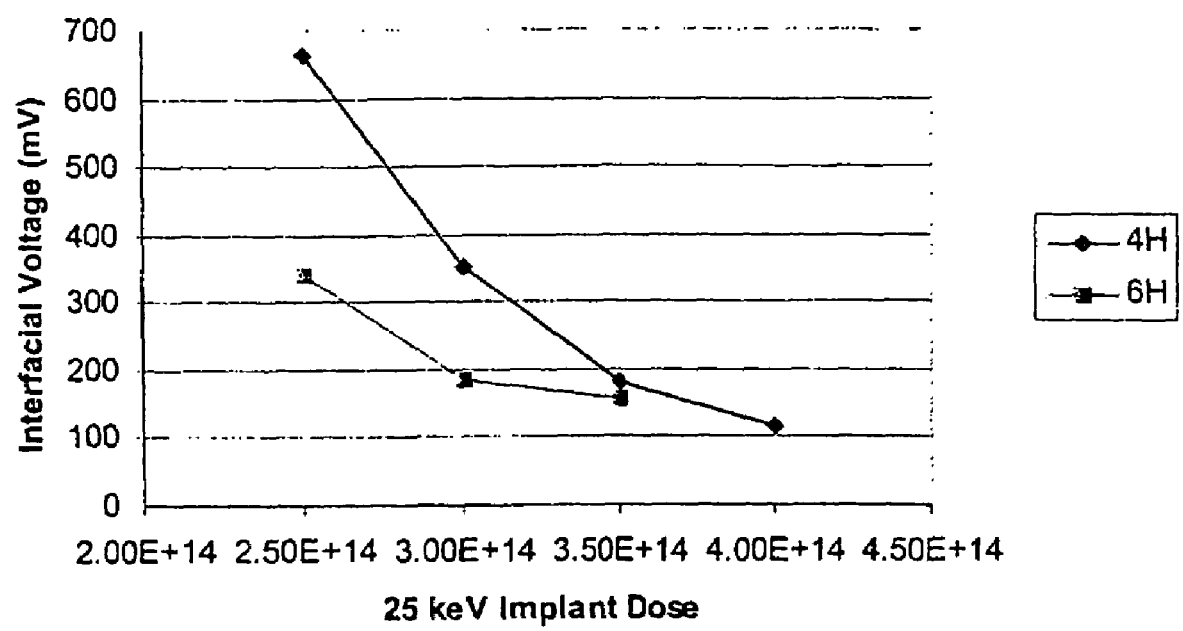
FIG. 6 is a graph of the interfacial voltage (Vf) at the substrate/buffer region interface versus 25 keV implant dose.

A graph of the interfacial voltage (Vf) at the substrate/buffer region interface versus 25 keV implant dose is shown in FIG. 6. To generate the data shown in FIG. 6, sample 4H and 6H silicon carbide wafers having a net concentration of nitrogen dopants of between 3.3E17 and 2.1E18 cm-3 were employed. A 500 Å thick PECVD silicon dioxide layer was formed on the surface of the wafers, and the wafers were implanted with various controlled doses of nitrogen at energy levels of 25 keV and 50 keV respectively. The implant doses and energy levels for each wafer are shown in Table 1.

TABLE 1

| Wafer | Type | Dopant | 25 keV Dose (cm$^{-2}$) | 50 keV Dose (cm$^{-2}$) |
|---|---|---|---|---|
| A | 4H | 28N2+ | 2.5E14 | 4.38E14 |
| B | 4H | 28N2+ | 3.0E14 | 5.25E14 |
| C | 4H | 28N2+ | 3.5E14 | 6.13E14 |
| D | 4H | 28N2+ | 4.0E14 | 7.0E14 |
| E | 6H | 28N2+ | 2.5E14 | 4.38E14 |
| F | 6H | 28N2+ | 3.0E14 | 5.25E14 |
| G | 6H | 28N2+ | 3.5E14 | 6.13E14 |

Conductive buffers were then formed on the implanted substrates. The interfacial voltage (i.e., the voltage drop attributable to the substrate/buffer interface) was measured at three locations on the wafer and an average value was calculated. The average values are plotted against the 25 keV implant dose in FIG. 6. As shown in FIG. 6, the interfacial voltage of the substrate/buffer interface decreases with increasing dosage.

The invention claimed is:

1. A silicon carbide structure suitable for use as a substrate in manufacturing electronic devices, said silicon carbide structure comprising:
    a silicon carbide wafer having a first and second surface and having a predetermined conductivity type and a net dopant concentration;
    a region of implanted and annealed dopant atoms extending from said first surface into said silicon carbide wafer to a depth of between about 10 and 5000 Angstroms, said region of implanted and annealed dopant atoms having a higher carrier concentration than said net dopant concentration in the remainder of said silicon carbide wafer, wherein said region of implanted and annealed dopant atoms has a peak concentration of implanted dopant atoms of between about 1E19 and 5E21 cm$^{-3}$; and
    a Group III nitride epitaxial layer on said first surface of said silicon carbide wafer, wherein said region of implanted and annealed dopant atoms is between the remainder of said silicon carbide wafer and said Group III nitride epitaxial layer.

2. A silicon carbide structure according to claim 1 wherein said silicon carbide wafer comprises n-type 6H-silicon carbide.

3. A silicon carbide structure according to claim 2 wherein said silicon carbide wafer is doped with nitrogen donor atoms.

4. A silicon carbide structure according to claim 1 wherein said region of implanted and annealed dopant atoms comprises phosphorus in a concentration of between about 1E19 and 5E21 cm$^{-3}$.

5. A silicon carbide structure according to claim 4 wherein said region of implanted and annealed dopant atoms comprises phosphorus in a concentration of about 1E21 cm$^{-3}$.

6. A silicon carbide structure according to claim 1 wherein said region of implanted and annealed dopant atoms comprises nitrogen in a concentration of between about 1E19 and 5E21 cm$^{-3}$.

7. A silicon carbide structure according to claim 6 wherein said region of implanted and annealed dopant atoms comprises nitrogen in a concentration of about 1E21 cm$^{-3}$.

8. A silicon carbide structure according to claim 1 wherein said silicon carbide wafer comprises n-type 4H-silicon carbide.

9. A silicon carbide structure according to claim 1 wherein said region of implanted and annealed dopant atoms extends from said first surface into said silicon carbide wafer to a depth of between about 800 and 1000 Angstroms.

10. A silicon carbide structure according to claim 1 wherein said region of implanted and annealed dopant atoms has a peak concentration of implanted dopant atoms of about 1E21 cm$^{-3}$ and extends from said first surface into said silicon carbide wafer to a depth of about 500 Angstroms.

* * * * *

UNITED STATES PATENT AND TRADEMARK OFFICE
CERTIFICATE OF CORRECTION

PATENT NO. : 7,675,068 B2  Page 1 of 1
APPLICATION NO. : 11/243581
DATED : March 9, 2010
INVENTOR(S) : Davis Andrew McClure et al.

It is certified that error appears in the above-identified patent and that said Letters Patent is hereby corrected as shown below:

On Page 2, Column 2, under OTHER PUBLICATIONS:

DELETE:

"M.B. SCOTT ET AL.; High temperature (500 degrees C) implantation study of P+ and N+ implanted epitaxial N-type 4H-SiC; Compound Semiconductors 1998, Processdings of the 25th International Symposium on Compound Semiconductors; Nara, Japan, October 12-16, 1998; pages 763-768; Vol. NR. 162; Institute of Physics Conference Series, London"

and INSERT:

--M.B. SCOTT ET AL.; High temperature (500 degrees C) implantation study of P+ and N+ implanted epitaxial N-type 4H-SiC; Compound Semiconductors 1998, Proceedings of the 25th International Symposium on Compound Semiconductors; Nara, Japan, October 12-16, 1998; pages 763-768; Vol. NR. 162; Institute of Physics Conference Series, London--

Signed and Sealed this

Twenty-seventh Day of April, 2010

David J. Kappos
*Director of the United States Patent and Trademark Office*